United States Patent
Mah et al.

(10) Patent No.: US 11,186,905 B2
(45) Date of Patent: Nov. 30, 2021

(54) ANTI-COKING IRON SPINEL SURFACE

(71) Applicant: NOVA Chemicals (International) S.A., Fribourg (CH)

(72) Inventors: Evan Mah, Calgary (CA); Vasily Simanzhenkov, Calgary (CA); Leslie Benum, Red Deer (CA); Hany Farag, Calgary (CA); Bolaji Olayiwola, Calgary (CA)

(73) Assignee: NOVA CHEMICALS (INTERNATIONAL) S.A., Fribourg (CH)

(*) Notice: Subject to any disclaimer, the term of this patent is extended or adjusted under 35 U.S.C. 154(b) by 231 days.

(21) Appl. No.: 15/901,121

(22) Filed: Feb. 21, 2018

(65) Prior Publication Data

US 2018/0251882 A1    Sep. 6, 2018

(30) Foreign Application Priority Data

Mar. 1, 2017    (CA) .................. CA 2959625

(51) Int. Cl.
 *C23C 8/16*    (2006.01)
 *C10G 35/00*   (2006.01)
 (Continued)

(52) U.S. Cl.
 CPC ........ *C23C 8/16* (2013.01); *B01J 8/24* (2013.01); *B01J 19/02* (2013.01); *C10G 9/203* (2013.01);
 (Continued)

(58) Field of Classification Search
 CPC ............ C23C 8/06–10; C23C 8/16–18; C23C 30/00–005; C23C 4/11; C23C 16/408;
 (Continued)

(56) References Cited

U.S. PATENT DOCUMENTS 4,524,643 A    6/1985    Ziegler et al.
4,613,372 A    9/1986    Porter et al.
(Continued)

FOREIGN PATENT DOCUMENTS

CN    102899067 B *    3/2015
EP    1636401            12/2004
(Continued)

OTHER PUBLICATIONS

Yamaguchi T., "Kinetic Studies of Eutectoid Decomposition of CuFe5O8" (Year: 1971).*

(Continued)

*Primary Examiner* — Alexandra M Moore
*Assistant Examiner* — Austin Pollock
(74) *Attorney, Agent, or Firm* — Fish & Richardson P.C.

(57) ABSTRACT

An anti-coking surface having a thickness up to 15 microns comprising from 15 to 50 wt. % of $MnCr_2O_4$ (for example manganochromite); from 15 to 25 wt. % of $Cr_{0.23}Mn_{0.08}Ni_{0.69}$ (for example chromium manganese nickel); from 10 to 30 wt. % of $Cr_{1.3}Fe_{0.7}O_3$ (for example chromium iron oxide); from 12 to 20 wt. % of $Cr_2O_3$ (for example eskolaite); from 4 to 20 wt. % of $CuFe_5O_8$ (for example copper iron oxide); and less than 5 wt. % of one or more compounds chosen from FeO(OH), CrO(OH), CrMn, Si and $SiO_2$ (either as silicon oxide or quartz) and less than 0.5 wt. % of aluminum in any form provided that the sum of the components is 100 wt. % is provided on steel.

14 Claims, 4 Drawing Sheets

(51) Int. Cl.
- *C23C 8/10* (2006.01)
- *C10G 9/20* (2006.01)
- *C22C 38/12* (2006.01)
- *C22C 38/16* (2006.01)
- *C22C 38/00* (2006.01)
- *C22C 30/00* (2006.01)
- *C22C 38/14* (2006.01)
- *C10G 11/18* (2006.01)
- *C22C 38/18* (2006.01)
- *C23C 8/02* (2006.01)
- *C23C 8/18* (2006.01)
- *C23C 16/40* (2006.01)
- *C23C 30/00* (2006.01)
- *B01J 19/02* (2006.01)
- *B01J 8/24* (2006.01)

(52) U.S. Cl.
CPC .............. *C10G 11/18* (2013.01); *C10G 35/00* (2013.01); *C22C 30/00* (2013.01); *C22C 38/00* (2013.01); *C22C 38/12* (2013.01); *C22C 38/14* (2013.01); *C22C 38/16* (2013.01); *C22C 38/18* (2013.01); *C23C 8/02* (2013.01); *C23C 8/10* (2013.01); *C23C 8/18* (2013.01); *C23C 16/405* (2013.01); *C23C 16/406* (2013.01); *C23C 30/00* (2013.01); *B01J 2219/0236* (2013.01); *C23C 16/408* (2013.01)

(58) Field of Classification Search
CPC . C23C 18/38; C23C 14/087; C23C 12/00–12; B01J 2219/0281; B01J 21/005
See application file for complete search history.

(56) References Cited

U.S. PATENT DOCUMENTS

| | | | |
|---|---|---|---|
| 5,520,751 A | 5/1996 | Pareek et al. | |
| 6,322,879 B1* | 11/2001 | Stewart | C23C 28/04 |
| | | | 427/372.2 |
| 6,602,483 B2 | 8/2003 | Heyse et al. | |
| 6,899,966 B2 | 5/2005 | Benum et al. | |
| 7,354,660 B2 | 4/2008 | Chun et al. | |
| 9,421,526 B2* | 8/2016 | Petrone | C23C 30/00 |
| 2004/0005239 A1* | 1/2004 | Szakalos | C22C 9/01 |
| | | | 420/489 |
| 2005/0077210 A1* | 4/2005 | Benum | C23C 8/18 |
| | | | 208/132 |
| 2005/0173300 A1 | 8/2005 | Szakalos et al. | |
| 2005/0257857 A1 | 11/2005 | Benum et al. | |
| 2006/0191600 A1 | 8/2006 | Omura et al. | |
| 2006/0269766 A1* | 11/2006 | Swank | C23C 8/14 |
| | | | 428/469 |
| 2006/0275551 A1* | 12/2006 | Hise | C10G 35/04 |
| | | | 427/383.1 |
| 2010/0015564 A1* | 1/2010 | Chun | C23C 28/322 |
| | | | 432/209 |
| 2016/0233524 A1* | 8/2016 | Leah | H01M 8/0228 |
| 2016/0258687 A1 | 9/2016 | Simanzhenkov et al. | |

FOREIGN PATENT DOCUMENTS

| | | | |
|---|---|---|---|
| GB | 2 159 542 A | 12/1985 | |
| GB | 2159542 A | * 12/1985 | ............... C23C 8/16 |
| JP | S5743989 A | 3/1982 | |

OTHER PUBLICATIONS

Yamaguchi T., "Eutectoid Decomposition of CuFe2O4—Fe3O4 Spinel Solid Solution Including CuFe5O8" (Year: 1969).*
Bergstein A., "Formation of the Spinel Cu0.5Fe2.5O4 from CuFe2O4 and aFe2O3" (Year: 1968).*
Bao B.; et al.; "High temperature oxidation of HP40 alloy under H2—H2O and air atmospheres: a surface study", Surface and Interface Analysis, 2017, 49, 873-879 (Year: 2017).*
Nishiyama et al., "The Role of Copper in Resisting Metal Dusting of Ni-Base Alloys," Materials Science Forum, dated Aug. 1, 2006, 522-523:581-588, XP055476982.
PCT International Search Report and Written Opinion in International Application No. PCT/IB2018/051162, dated May 28, 2018, 14 pages.
Mingzeng et al., ""Synthesis of anti-coking oxide film on surface of 35Cr45Ni alloy by low oxygen partial pressure,"" Journal of China University of Petroleum, dated Aug. 1, 2010, 34(4):127-130, 135, XP009505424 (with English abstract).
Wei et al., "Conversion of copper and manganese metallic films to spinel coating", Journal of Materials Science, dated Mar. 30, 2012, 47:5205-5215, XP035041611.
Young et al., "Recent Advances in Understanding Metal Dusting: A Review," Materials and Corrosion, dated 2011, 62(1): 7-28.

* cited by examiner

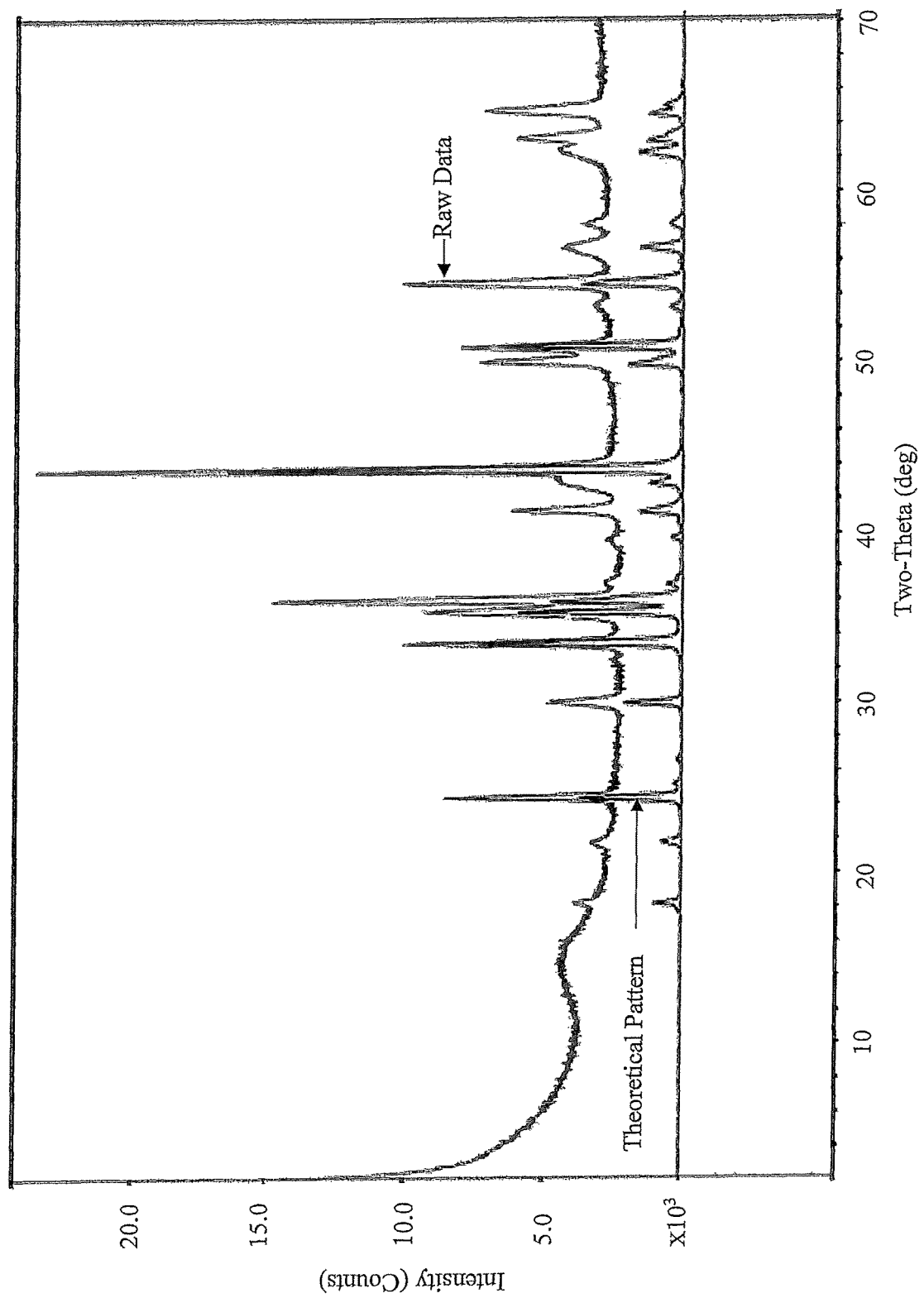
Figure 3 – X-ray diffraction signal

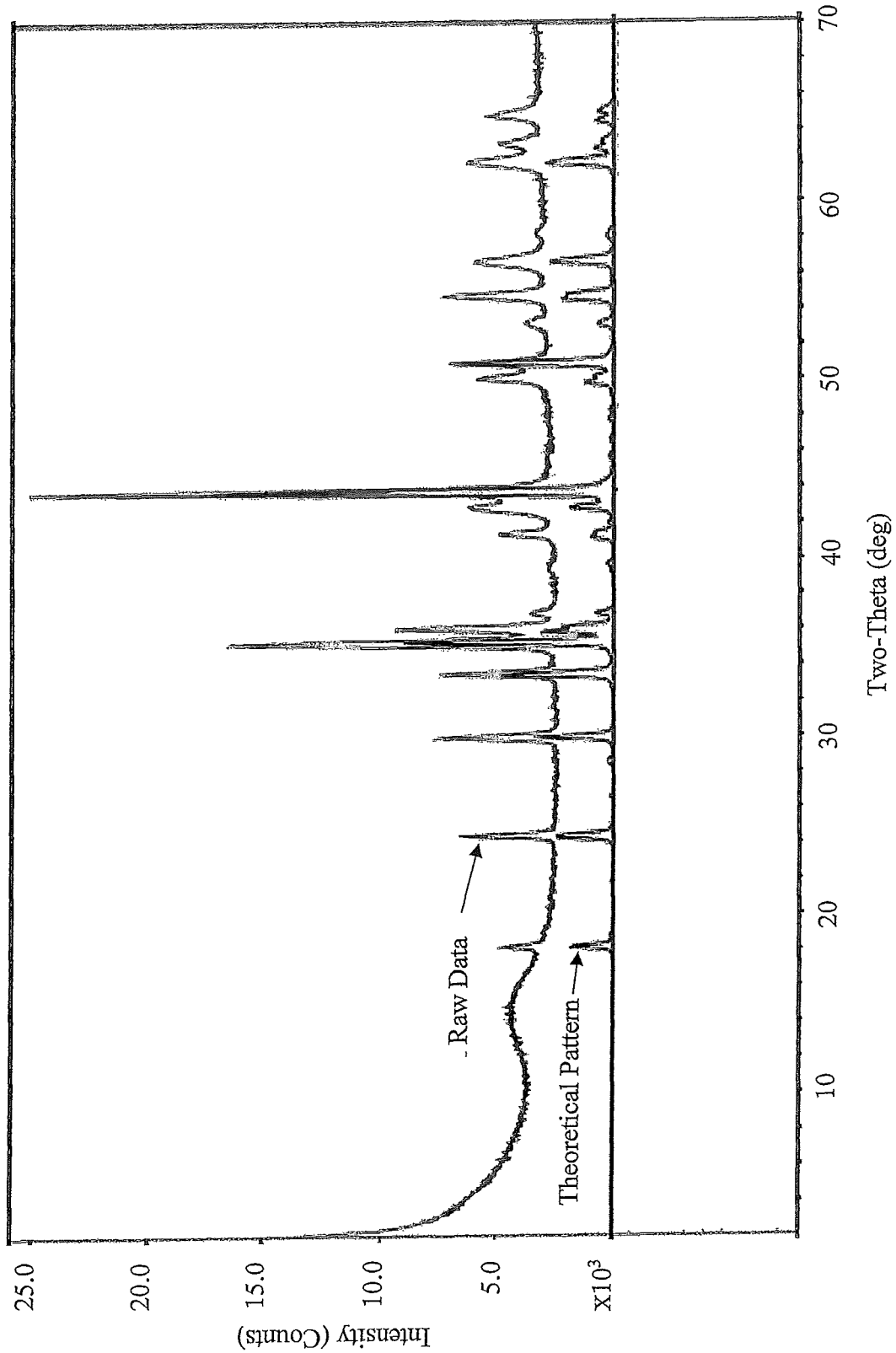
Figure 4 – X-ray diffraction signal

ANTI-COKING IRON SPINEL SURFACE

The present disclosure relates to an iron spinel surface on a substrate, comprising, for example, from 20 to 50 wt. % of Ni. In some embodiments, the iron spinel surface has a thickness up to about 15 microns. The surface is useful to resist carbon formation or carburization in environments where one or more hydrocarbons may be heated to temperatures from about 500° C. to about 1000° C. This can include typical hydrocarbon processes such as cracking and reforming and more diverse application in piping in iron ore reduction furnaces to jet engines.

There are a number of patents in the name of Benum et al., assigned to NOVA Chemicals (International) S.A. relating to the production of chromium based spinels on high NI Cr steels. The spinels typically have the formula $MnCr_2O_4$ alone or in combination with oxides of Mn or Si. The spinels of the present disclosure comprise iron copper based spinels and are distinct from those of Benum.

GB 2 159 542, published Dec. 4, 1985, in the name of Man Maschinenfabrik Augsburg Nurnberg, teaches treating various steels to produce protective coatings. Embodiment 5 (process variant b) teaches producing a surface coating of $Fe_3O_4$ on a steel substrate. Embodiment 6 (process variant b) teaches producing a chrome iron spinel $(Fe,Cr)_3O_4$ on a steel substrate. The patent teaches away from the surface compositions of the present disclosure.

U.S. Pat. Nos. 4,613,372 and 4,524,643 describe certain antifoulants which are combinations of tin and copper, antimony and copper, and tin, antimony and copper. This teaches against the subject matter of the present disclosure.

U.S. Pat. No. 5,520,751, issued May 28, 1996 to Pareek et al., assigned to Exxon Research and Engineering Company, teaches oxidizing a low chromium steel to produce a surface which is an iron chromium spinel $(FeCr_2O_4)$. The reference fails to teach or suggest treating the surface of the metal with copper; nor does the reference teach the final surface composition of the present disclosure.

U.S. Pat. No. 6,602,483, issued Aug. 5, 2003 to Heyse et al., assigned to Chevron Phillips, teaches several concepts for treating steam crackers. One concept is to form a uniform metallic coating of a metal, such as copper. When copper is used, it is bonded to the steel with a layer of tin (Col. 8, lines 30-65). The present disclosure does not require the intermediate binder coating of this patent.

Abandoned published U.S. Patent Application Publication No, 2006-0191600 teaches a compound oxide film containing prescribed amounts of Fe, Cr and Al in the form of oxides which provides a barrier against hydrogen penetration into the steel substrate and resulting hydrogen embrittlement of the steel. The barrier films do not include copper. Copper may be plated over the resulting compound oxide film (paragraph 38).

In some embodiments, the present disclosure seeks to provide a coating comprising an iron copper spinel coating which resists coke formation in an environment where the spinel is exposed to hydrocarbons at elevated temperatures.

In one embodiment, the present disclosure provides a metal substrate comprising from 20 to 50 wt. % of and less than 0.05 wt. % of one or more elements chosen from Cu and Al covering not less than 75% of a treated substrate surface, a surface having a thickness up to 15 microns comprising from 15 to 50 wt. % of $MnCr_2O_4$ (for example manganochromite); from 15 to 25 wt. % of $Cr_{0.23}Mn_{0.08}Ni_{0.69}$ (for example chromium manganese nickel); from 10 to 30 wt. % of $Cr_{1.3}Fe_{0.7}O_3$ (for example chromium iron oxide); from 12 to 20 wt. % of $Cr_2O_3$ (for example eskolaite); from 4 to 20 wt. % of $CuFe_5O_8$ (for example copper iron oxide); and less than 5 wt. % of one or more compounds chosen from FeO(OH), CrO(OH), CrMn, Si and $SiO_2$ (either as silicon oxide or quartz) and less than 0.5 wt. % of aluminum in any form, provided that the sum of the components is 100 wt. %.

In a further embodiment, the metal substrate further comprises from 13 to 50 wt. % of Cr and 0.2 to 3.0 wt. % Mn.

In a further embodiment, the metal substrate further comprises from 0.3 to 2.0 wt. % of Si and less than 5 wt. % of titanium, niobium and all other trace metals, and carbon in an amount less than 0.75 wt. %.

In a further embodiment, in the metal substrate, Cr is present in an amount from 20 to 38 wt. %.

In a further embodiment, in the metal substrate, Ni is present in an amount from 25 to 48 wt. %.

In a further embodiment, the surface has a crystallinity of not less than 40% and a (an average) crystal size less than 5 microns, for example less than 2 microns.

In a further embodiment, the surface has a thickness less than 12 microns.

In a further embodiment, the surface comprises from 15 to 25 wt. % of $MnCr_2O_4$ (for example manganochromite); from 20 to 24 wt. % of $Cr_{0.23}Mn_{0.08}Ni_{0.69}$ (for example chromium manganese nickel); from 20 to 30 wt. % of $Cr_{1.3}Fe_{0.7}O_3$ (for example chromium iron oxide); from 15 to 20 wt. % of $Cr_2O_3$ (for example eskolaite); from 4 to 7 wt. % of $CuFe_5O_8$ (for example copper iron oxide); and less than 5 wt. % of one or more compounds chosen from FeO(OH), CrO(OH), CrMn, Si and $SiO_2$ (either as silicon oxide or quartz) and less than 0.5 wt. % of aluminum in any form, provided that the sum of the components is 100 wt. %.

In a further embodiment, the surface comprises from 40 to 50 wt. % of $MnCr_2O_4$ (for example manganochromite); from 15 to 20 wt. % of $Cr_{0.23}Mn_{0.08}Ni_{0.69}$ (for example chromium manganese nickel); from 10 to 15 wt. % of $Cr_{1.3}Fe_{0.7}O_3$ (for example chromium iron oxide); from 12 to 18 wt. % of $Cr_2O_3$ (for example eskolaite); from 8 to 18 wt. %, in some embodiments from 8 to 12 wt. %, of $CuFe_5O_8$ (for example copper iron oxide); and less than 5 wt. % of one or more compounds chosen from FeO(OH), CrO(OH), CrMn, Si and $SiO_2$ (either as silicon oxide or quartz) and less than 0.5 wt. % of aluminum in any form provided that the sum of the components is 100 wt. %.

In a further embodiment, there is provided a reactor having at least a portion of its internal surface according to claim 1.

In a further embodiment, the reactor has an operating temperature from 700° C. to 1300° C.

In a further embodiment, the reactor is an iron ore reduction reactor (smelter).

In a further embodiment, the reactor is a steam cracking furnace.

In a further embodiment, the reactor is a hydrocarbon reformer.

In a further embodiment, the reactor is fluidized bed catalyst cracker.

In a further embodiment, the reactor is a jet engine (e.g., injector nozzles and fan blades etc. comprise the coating disclosed herein).

In a further embodiment, there is provided a process to produce the above surface comprising applying to not less than 75% of the surface of the substrate (being treated) a uniform coating comprising 80 wt. % of one or more of copper and copper oxides, provided the metallic copper is present in an amount of less than 10 wt. %, and less than 2 wt. % trace elements including Si having a thickness up to 12 microns, and heating the surface to a temperature from 500° to 1000° C. under alternating oxidizing atmosphere for 15 to 20 hours and reducing atmosphere for a total time from 1 to 2 hours.

In a further embodiment, an individual treatment under an oxidizing atmosphere is from 16 to 18 hours.

In a further embodiment, the copper oxide is present in the coating in an amount of not less than 90 wt. % based on the weight of the coating.

In a further embodiment, the coating is a chemical vapor deposition (CVD) coating.

In a further embodiment, the coating is a spray coating.

In a further embodiment, the coating is a laser ablation coating.

In a further embodiment, there is provided a method for treating a hydrocarbon using a reactor as above.

BRIEF DESCRIPTION OF THE FIGURES

FIG. 3 is an X-ray diffraction pattern both actual and theoretical of the surface of example 1.

FIG. 4 is an X-ray diffraction pattern both actual and theoretical of the surface of example 2.

Figure 1:
FIG. 1 is a quantitative elemental distribution for the surface of example 1 derived from the SEM and Elemental Spectrograph for example 1.

In a number of industries, particularly the chemical industry, stainless steel substrates are used to form equipment (e.g., furnace tubes, steam reforming reactors, heat exchangers and reactors) used in harsh environments which may result in coking of the stainless steel surface. In an ethylene furnace, the furnace tubes may be a single tube or tubes and fittings welded together to form a coil which may be subject to coke build-up (coking). In hydrocarbon reformers the reactors and piping are subject to similar coking issues. In fluidized catalyst cracker, particularly in the down corner, there are similar issues. In the piping for gases generated in iron ore reduction processes and particularly fluidized bed iron ore reduction, there are similar issues. In gas powered turbines (e.g., jet engines), there are also coke build up issues on components in the turbine.

The substrate may be any material to which the composite coating will bond. The substrate may be a carbon steel or a stainless steel which may be chosen from wrought stainless, austentic stainless steel and HP, HT, HU, HW and HX stainless steel, heat resistant steel, and nick& based alloys. The substrate may be a high strength low alloy steel (HSLA); high strength structural steel or ultra-high strength steel. The classification and composition of such steels are known to those skilled in the art.

In one embodiment, the stainless steel, for example, heat resistant stainless steel typically comprises from 13 to 50, for example, 20 to 50, or, for example, from 20 to 38 weight % of chromium. The stainless steel may further comprise from 20 to 50, for example, from 25 to 50, or, for example, from 25 to 48, or, for example, from about 30 to 45 wt. % of Ni. The balance of the stainless steel is substantially iron.

The present disclosure may also be used with nickel and/or cobalt based extreme austenic high temperature alloys (HTAs). In some embodiments, the alloys comprise a major amount of nickel or cobalt. In some embodiments, the high temperature nickel based alloys comprise from about 50 to 70, for example, from about 55 to 65 wt. % of Ni; from about 20 to 10 wt. % of Cr; from about 20 to 10 wt. % of Co; and from about 5 to 9 wt, % of Fe, and the balance one or more of the trace elements noted below to bring the composition up to 100 wt. %. In some embodiments, the high temperature cobalt based alloys comprise from 40 to 65 wt. % of Co; from 15 to 20 wt. % of Cr; from 20 to 13 wt, % of Ni; less than 4 wt. % of Fe and the balance one or more trace elements as set out below and up to 20 wt. % of W. The sum of the components adding up to 100 wt. %.

In some embodiments, disclosed herein, the substrate may further comprise at least 0.2 wt. %, up to 3 wt. %, typically, 1.0 wt. %, up to 2.5 wt. %, for example, not more than 2 wt. % of manganese from 0.3 to 2, for example, 0.8 to 1.6, for example, less than 1.9 wt. % of Si; less than 3, for example, less than 2 wt. % of titanium, niobium (for example, less than 2.0, for example, less than 1.5 wt, % of niobium) and all other trace metals; and carbon in an amount of less than 2.0 wt. %.

The protective coating should cover not less than 75%, for example more than 85%, desirable more than 95% of the surface area of the treated surface(s) of the substrate.

In some embodiments, the surface layer or coating has a thickness up to 10 microns, in some instances, 7 microns, for example, 5 or less microns, in some embodiments, at least 1.5 microns, for example, 2 microns thick. In some embodiments, the surface has a crystallinity of not less than 40%, for example, greater than 60% and a (an average) crystal size up to 7, microns, for example, less than 5 microns, for example, less than 2 microns. In some embodiments, the surface covers at least about 70%, for example, 85%, or for example, not less than 95%, for example, not less than 98.5% of the surface of the substrate.

The low coking surface is prepared by coating the desired surface of the substrate with one or more of copper and oxides of copper oxide such as CuO, $Cu_2O$ and mixtures thereof. The coating may be applied using any conventional method for coating including chemical vapor deposition (CVD), spray coating, laser ablation coating and the like. Generally, the coating is thin, having a thickness not more than about 15 microns, for example, less than 12 microns, or, for example, from about 3 to 12 microns.

The coating should comprise not less than 60 wt. % of one or more copper oxides (CuO and $Cu_2O$) and mixtures thereof and not more than 2 wt. % trace elements including Si. For example, the one or more copper oxides are present in an amount of not less than 90 wt. %, for example, not less than 95 wt. %, for example, in an amount of at least 98 wt. % of the coating. In some embodiments, the elemental copper (as opposed to the oxides) should be present in an amount of less than 10 wt. %, for example, less than 5 wt. % of the coating as applied. This copper may be oxidized during the subsequent heat treatment.

The coating is then subjected to successive oxidation and reduction treatments generally at a temperatures from 500° C. to 1000° C., for example from about 700° C. to about 950° C. There should be at least 3, cycles of oxidation and reduction in some embodiments 5 or more. Higher number of cycles of oxidation and reduction are preferred, for example, 8 or more.

The oxidizing atmosphere may be a mixture of steam and air, for example, from 30 to 90 wt, % steam and from 60 to 10 wt. % air, in some embodiments, from 60 to 90 wt. % steam and from 40 to 60 wt. % air, in further embodiments, from 75 to 85 wt. % steam and from 25 to 15 wt. % of air. In some embodiments, the air may be replaced with oxygen mixed with inert gases, such as, nitrogen, such as, 20 wt. % oxygen and 80 wt. % inert gas. The reducing atmosphere may be a mixture of steam and ethane in a mass (weight)

ratio of about 3:1 (e.g., from about 2.85:1 to about 3.15:1). The total treatment time for one cycle of oxidizing should be not less 16 hours (one oxidation cycle of 15 hours and one reduction cycle of 1 hour) and may be as long as 22 hours (one oxidation cycle of 20 hours and one reduction cycle of 2 hours). The total time for the treatment may be a minimum of 48 hours (3 cycles of 16 hours) for example at least 66 hours (three cycles of 22 hours), in some embodiments at least 110 hours (5 cycles of 22 hours) in some embodiments at least 176 hours (8 cycles of 22 hours).

The substrate metal (steel) is manufactured into a part and then the appropriate surface is treated. The steel may be forged, roped or cast. In one embodiment disclosed herein, the steel is in the form of pipes or tubes. The tubes have an internal surface in accordance with the present disclosure. These tubes may be used in petrochemical processes, such as, cracking of hydrocarbons and, in particular, the cracking of ethane, propane, butane, naphtha, and gas oil, or mixtures thereof. The stainless steel having the coating of the present disclosure may be in the form of a reactor or vessel having an interior surface in accordance with the present disclosure. The stainless steel may be in the form of a heat exchanger in which either or both of the internal and/or external surfaces are in accordance with the present disclosure. Such heat exchangers may be used to control the enthalpy of a fluid passing in or over the heat exchanger. The treated steel could be used to form a reactor for reforming hydrocarbons. The down-corner in a fluidized catalytic cracker could be made using a steel having the coating of the present disclosure. Further piping to convey reducing gases in a fluidized iron ore reduction reactor may be made from steel treated in accordance with the present disclosure. Finally steel treated in accordance with the present disclosure could be used in a turbine (either stationary for power generation or moving (jet engine). Parts of the turbine susceptible to carbon build up could be coated in accordance with the present disclosure.

A useful application for the surfaces of the present disclosure is in furnace tubes or pipes used for the cracking of alkanes (e.g., ethane, propane, butane, naphtha, and gas oil, or mixtures thereof) to olefins (e.g., ethylene, propylene, butene, etc.). Generally, in such an operation, a feedstock (e.g., ethane) is fed in a gaseous form to a tube, pipe or coil typically having an outside diameter ranging from 1.5 to 8 inches (e.g., typical outside diameters are 2 inches about 5 cm; 3 inches about 7.6 cm; 3.5 inches about 8.9 cm; 6 inches about 15.2 cm and 7 inches about 17.8 cm). The tube or pipe runs through a furnace generally maintained at a temperature from about 900° C. to 1050° C., and the outlet gas generally has a temperature from about 800° C. to 900° C. As the feedstock passes through the furnace, it releases hydrogen (and other byproducts) and becomes unsaturated (e.g., ethylene). The typical operating conditions, such as, temperature, pressure and flow rates for such processes, are well known to those skilled in the art.

Typical pyrolysis furnace operating conditions include those well known in the art, for example, temperatures ranging from 750° C. to 1100° C., residence times from 0.05 to 0.6 seconds, and relatively low hydrocarbon partial pressures such as in the range from 20 to 30 psia, in some embodiments, from 22 to 28 psia. The downstream processing of the effluent uses conventional equipment and methodology, e.g., transfer line exchanger and/or quench exchanger, olefins distillation and recovery, etc.

Reformers are used to partially hydrogenate a hydrocarbon, for example, an aliphatic or aromatic hydrocarbon, an alcohol, an aldehyde or an ester to generate a syn gas. The reactors are typically tubular and contain a core catalytic bed and a coaxial shell. The feed generally a heavier aliphatic or aromatic feed, is fed in vapor form into the catalytic bed. Steam is also fed to the reactor and passes through the catalytic bed. The steam reacts (Fischer Tropsch) with the feed and typically generates a lower alkane product (Syn gas) and a partially cracked feed gas, typically having branches. The temperatures at which the reaction is conducted may range from about 500° C. to about 800° C. The pressures may be from about 5 to 45 atmospheres (about 520 kPa to about 4200 kPa). Generally, the process produces components for blending into gasoline having a higher octane value. By products include lower alkanes such as ethane and hydrogen. Metals having the protective surface of the present disclosure may be used in the reactors or piping for the reactors, particularly where there are two or more reactors in series.

Steels having a coating in accordance with the present disclosure may be used in the reactor and piping for a fluidized bed catalytic cracker. These reactors are well known to those skilled in the art. The reactor is typically a cylindrical reactor. Feed, generally a higher molecular weight aromatic feed such as a vacuum gas oil, enters a line entering the base of the reactor. Also entering the base or a lower portion of the reactor is a stream of catalysts which has been cleaned of coke. The feed passes upwardly through a fluidized catalyst bed and is heated to between 500° C. and 800° C. and is cracked, During the cracking process, the catalyst becomes "coked". Catalyst is removed from the fluidized bed and is returned to a regenerator by a down corner line. In the regenerator, the coke is burned. The catalyst particles and the catalyst is then returned to the fluidized bed in the reactor. Steels having the coating of the present disclosure may be used in the parts of the fluidized catalyst cracker where there is a tendency for coking such as the upper part of the reactor and the down corner.

Steels having the coating of the present disclosure may be used in fluidized iron ore reduction processes such as disclosed in published U.S. Patent Application Publication No, 20160258687, published Sep. 8, 2016, in the name of Simanzhenkov et al. In the process, a reducing gas, typically comprising combustion products of coke, are passed counter current to a downward flow of iron ore being reduced in a series of reactors. The reducing gases tend to coke in the lines between the reactors.

Steels having the coating of the present disclosure could also be used in the manufacture of cement. The lines burners and associated parts could be made of steel coated in accordance with the present disclosure.

Steels having the coating of the present disclosure could also be used in jet turbines either stationary for electrical generation or mobile in airplanes. The fuel injectors and fan components in the combustion zone could be coated with steels having the coating of the present disclosure to reduce coking of the engine.

The present invention will now be illustrated by the following examples.

A sample of a cast hydrogen treated stainless steel tube or pass comprising 35/45 chrome nickel was coated on its internal surface with copper oxide(s) by chemical vapor deposition to provide a surface coating (having a thickness less than 15 microns). The resulting samples were heated in a technical reactor at a temperature of about 850° C. and the tube was subjected to 3 alternating cycles of oxidizing (steam and air) and reducing (ethane) atmospheres also at about 850° C.

Figure 2:
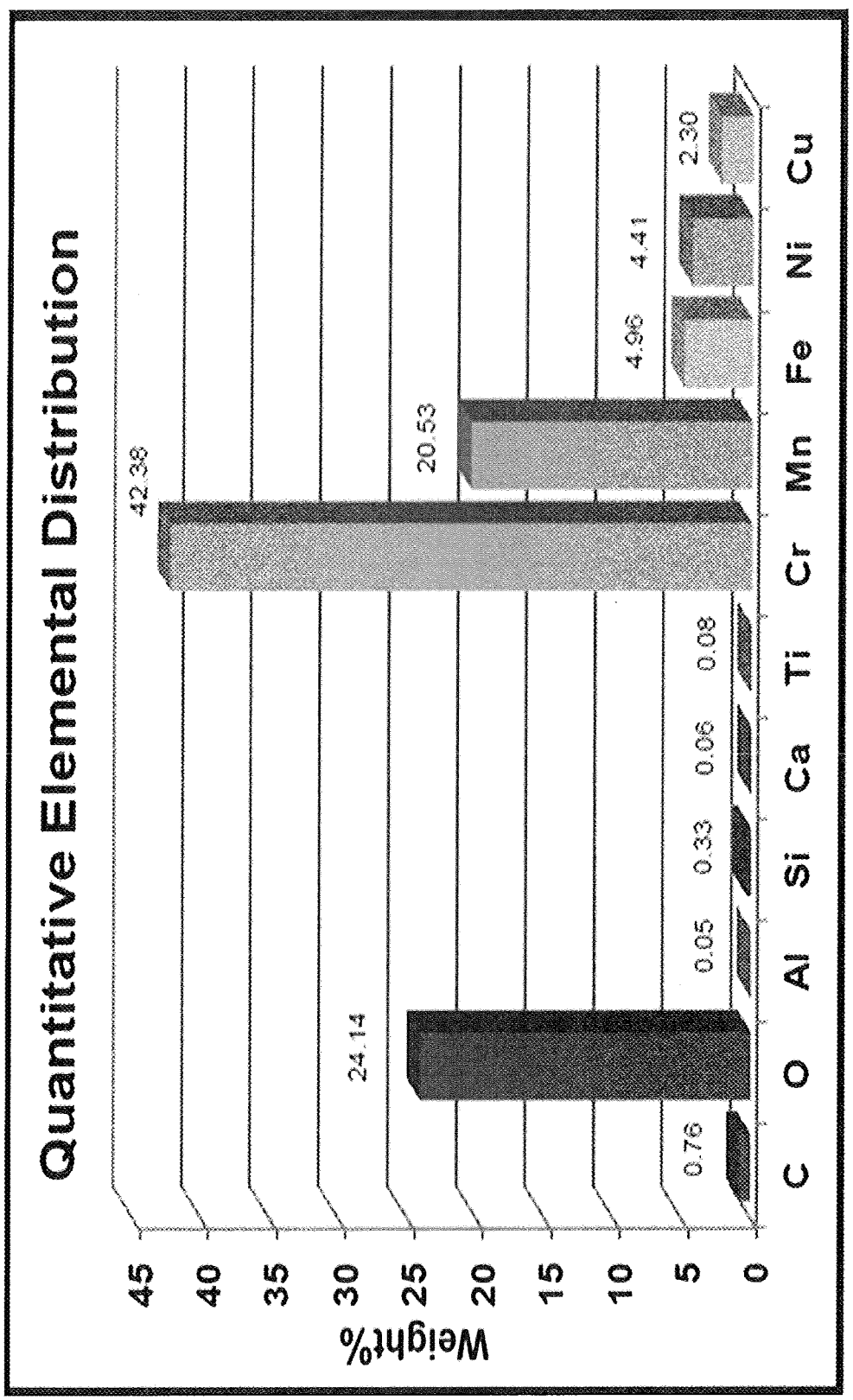
FIG. 2 is a quantitative elemental distribution for the surface of example 2 derived from the SEM and Elemental Spectrograph for example 2.

An X-ray, SEM and an elemental spectrograph were taken for the surface (e.g., about 5 microns) each sample. From this data a quantitative elemental distribution for each sample was developed. These are shown in FIGS. 1 and 2 for surfaces 1 and 2 respectively.

The major components for the surface for each sample are shown below.

| Sample 1 Elements: | | |
|---|---|---|
| Dominant: Cr | Moderate: C, Si, Mn, Fe, Cu | |
| Common: O | Minor-Trace: AL, Cl, Ca, Ti, Ni | |
| Compounds Formula | Name | Percentage |
| $Cr_{1.3}Fe_{0.7}O_3$ | Chromium Iron Oxide | 27.3% |
| $Cr_{0.23}Mn_{0.08}Ni_{0.69}$ | Chromium Manganese Nickel | 22.4% |
| $Cr_2O_3$ | Eskolaite | 20.0% |
| $MnCr_2O_4$ | Manganochromite | 17.1% |
| $CuFe_5O_8$ | Copper Iron Oxide | 8.6% |
| Cr + 3O(OH) | Bracewellite | 2.0% |
| $SiO_2$ | Silicon Oxide | 2.0% |
| $SiO_2$ | Quartz | 0.6 |
| Sample 2 Elements: | | |
| Dominant: O, Cr, Mn | Moderate: Fe, Ni, Cu | |
| Common: | Minor-Trace: C, Al, Si, Ca, Ti | |
| Compounds: Formula | Name | Percentage |
| $MnCr_2O_4$ | Manganochromite | 48.1% |
| $Cr_{0.23}Mn_{0.08}Ni_{0.69}$ | Chromium Manganese Nickel | 17.8% |
| $Cr_2O_3$ | Eskolaite | 14.6% |
| $Cr_{1.3}Fe_{0.7}O_3$ | Chromium Iron Oxide | 12.3% |
| $CuFe_5O_8$ | Copper Iron Oxide | 4.4% |
| FeO(OH) | Ferrihydrite | 1.1% |
| CrMn | Chromium Manganese | 1.1% |
| Si | Silicon | 0.2% |
| $SiO_2$ | Silicon Oxide | 0.2% |
| $SiO_2$ | Quartz | 0.2% |

A sample of a Ni/Cr austentic stainless steel was prepared according to U.S. Pat. No. 6,899,966, issued May 31, 2005 to Benum et al., assigned to NOVA Chemicals (International) S.A. From experience with testing pipe samples, including those of U.S. Pat. No. 6,899,966 in the Technical Scale reactor it is known that after the initial 5 to 9 hours of steam cracking of ethane to ethylene there is very little incremental coke generated.

The sample according to U.S. Pat. No. 6,899,966 ran for about 30 hours in steam cracking mode. Sample 1 ran for about 12 hours in steam cracking mode of ethane to ethylene. Both pipe or tube samples were of the same size. Both runs used the same start-up, operating and shut down procedures. Ethane Conversion, Ethylene Yield and coke-make were measured for each sample. The results are reported in table 1.

TABLE 1

| | Tube according to U.S. Pat. No. 6,899,966 | Coated according to the present invention |
|---|---|---|
| Ethane Conversion | 64.72% | 66.67% |
| Ethylene Yield | 76.48% | 77.21% |
| Coke-make (g) | 43.18 | 36.83 |

From Table 1 it is clear the coatings of the present disclosure are at least equal, if not superior, to those of U.S. Pat. No. 6,899,966.

What is claimed is:

1. A metal substrate comprising from 20 to 50 wt. % of Ni and less than 0.05 wt. % of one or more elements chosen from Cu and Al, comprising a protective coating covering not less than 75% of a surface of the metal substrate, the protective coating having a thickness of up to 15 microns and comprising from 15 to 50 wt. % of manganochromite, from 15 to 25 wt. % of chromium manganese nickel; from 10 to 30 wt. % of chromium iron oxide; from 12 to 20 wt. % of eskolaite; from 4 to 12 wt. % of copper iron oxide; less than 5 wt. % of one or more compounds chosen from FeO(OH), CrO(OH), CrMn, Si and $SiO_2$; and less than 0.5 wt. % of aluminum in any form.

2. The metal substrate according to claim 1, wherein the manganochromite has the formula $MnCr_2O_4$.

3. The metal substrate according to claim 1, wherein the chromium manganese nickel has the formula $Cr_{0.23}Mn_{0.08}Ni_{0.69}$.

4. The metal substrate according to claim 1, wherein the chromium iron oxide has the formula $Cr_{1.3}Fe_{0.7}O_3$.

5. The metal substrate according to claim 1, wherein the eskolaite has the formula $Cr_2O_3$.

6. The metal substrate according to claim 1, wherein the copper iron oxide is $CuFe_5O_8$.

7. The metal substrate according to claim 1, wherein the metal substrate further comprises from 13 to 50 wt. % of Cr and 0.2 to 3.0 wt. % of Mn.

8. The metal substrate according to claim 7, wherein the metal substrate further comprises from 0.3 to 2.0 wt. % of Si and less than 5 wt. % of titanium, niobium and all other trace metals, and carbon in an amount less than 0.75 wt. %.

9. The metal substrate according to claim 8, wherein in the metal substrate Cr is present in an amount from 20 to 38 wt. %.

10. The metal substrate according to claim 9, wherein in the metal substrate Ni is present in an amount from 25 to 48 wt. %.

11. The metal substrate according to claim 10, wherein the protective coating has a crystallinity of not less than 40% and an average crystal size of less than 5 microns.

12. The metal substrate according to claim 11, wherein the protective coating has a thickness of less than 12 microns.

13. The metal substrate according to claim 12, wherein the protective coating comprises from 15 to 25 wt. % of manganochromite; from 20 to 24 wt. % of chromium manganese nickel; from 20 to 30 wt. % of chromium iron oxide; from 15 to 20 wt. % of eskolaite; from 8 to 12 wt. % of copper iron oxide; and less than 5 wt. % of one or more compounds chosen from FeO(OH), CrO(OH), CrMn, Si and $SiO_2$ and less than 0.5 wt. % of aluminum in any form.

14. The metal substrate according to claim 12, wherein the protective coating comprises from 40 to 50 wt. % of manganochromite; from 15 to 20 wt. % of chromium manganese nickel; from 10 to 15 wt. % of chromium iron oxide; from 12 to 18 wt. % of eskolaite; from 4 to 7 wt. % of copper iron oxide; and less than 5 wt. % of one or more compounds chosen from FeO(OH), CrO(OH), CrMn, Si and $SiO_2$ and less than 0.5 wt. % of aluminum in any form.

* * * * *

UNITED STATES PATENT AND TRADEMARK OFFICE
CERTIFICATE OF CORRECTION

PATENT NO. : 11,186,905 B2
APPLICATION NO. : 15/901121
DATED : November 30, 2021
INVENTOR(S) : Evan Mah et al.

Page 1 of 1

It is certified that error appears in the above-identified patent and that said Letters Patent is hereby corrected as shown below:

In the Claims

Column 8, Line 12, Claim 1, delete "manganochromite," and insert -- manganochromite; --.

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*